United States Patent
Kim

(10) Patent No.: US 7,227,210 B2
(45) Date of Patent: Jun. 5, 2007

(54) FERROELECTRIC MEMORY TRANSISTOR WITH HIGHLY-ORIENTED FILM ON GATE INSULATOR

(75) Inventor: Hong Koo Kim, Pittsburgh, PA (US)

(73) Assignee: Hynix Semiconductor, Inc., Ichon-Shi (KR)

(*) Notice: Subject to any disclaimer, the term of this patent is extended or adjusted under 35 U.S.C. 154(b) by 0 days.

(21) Appl. No.: 10/960,219

(22) Filed: Oct. 6, 2004

(65) Prior Publication Data

US 2005/0059172 A1 Mar. 17, 2005

Related U.S. Application Data

(62) Division of application No. 09/747,779, filed on Dec. 22, 2000, now Pat. No. 6,815,219.

(60) Provisional application No. 60/173,175, filed on Dec. 27, 1999.

(51) Int. Cl.
*H01L 29/78* (2006.01)

(52) U.S. Cl. .................. 257/295; 257/324; 257/411; 257/E29.272

(58) Field of Classification Search .............. 257/295, 257/296, 310, 324, 410, 411, E29.272
See application file for complete search history.

(56) References Cited

U.S. PATENT DOCUMENTS 5,955,755 A * 9/1999 Hirai et al. .................. 257/295

* cited by examiner

*Primary Examiner*—Marcos D. Pizarro
(74) *Attorney, Agent, or Firm*—Townsend and Townsend and Crew LLP

(57) ABSTRACT

A method for fabricating a non-volatile memory device. The method includes providing a substrate, e.g., silicon. The method also includes forming an oxide layer overlying the substrate; and forming a buffer layer overlying the oxide layer. A ferroelectric material is formed overlying the substrate and is formed preferably overlying the buffer layer. The method also includes forming a gate layer overlying the ferroelectric material, where the gate layer is overlying a channel region. The method further includes forming first source/drain region adjacent to a first side of the channel region and a second source/drain region adjacent to a second side of the channel region. In other embodiments, the method can also include other steps.

9 Claims, 16 Drawing Sheets

FERROELECTRIC MEMORY TRANSISTOR WITH HIGHLY-ORIENTED FILM ON GATE INSULATOR

CROSS-REFERENCES TO RELATED APPLICATION

This application is a divisional of U.S. patent application Ser. No. 09/747,779, filed on Dec. 22, 2000 now U.S. Pat. No. 6,815,219, which claims priority from U.S. Provisional Patent Application No. 60/173,175, entitled "Fabrication Method and Structure for Ferroelectric Non-volatile Memory Field Effect Transistor," filed Dec. 27, 1999, which are both incorporated by reference for all purposes.

BACKGROUND OF THE INVENTION

The present invention relates to the manufacture of objects. More particularly, the invention provides a method and resulting structure for a memory device using a ferroelectric material.

Memory cells are used in the implementation of many types of electronic devices and integrated circuits. These devices include microprocessors, static random access memories ("SRAMs"), erasable-programmable read only memories ("EPROMs"), electrically erasable programmable read only memories ("EEPROMs"), Flash EEPROM memories, programmable logic devices ("PLDs"), field programmable gate arrays ("FPGAs"), application specific integrated circuits ("ASICs"), among others. Memory cells are used to store the data and other information for these and other integrated circuits.

As integrated circuit technology and semiconductor processing continue to advance, there is a need for greater densities and functionality in integrated circuits, which are often determined in a large part by the size of the memory cells. Further, it is desirable that the memory cells have improved operating characteristics, such as lower power consumption, nonvolatility, greater device longevity, improved data retention, better transient performance, superior voltage and current attributes, and improvements in other similar attributes.

Volatile memory devices are commonly used in many integrated circuit applications. These memory devices include, among others, dynamic random access memory ("DRAMs") and others. Unfortunately, DRAM devices often require power to maintain the memory state of the device. Accordingly, other devices such as flash memory devices and the like have been proposed. These devices, however, are often larger and more difficult to scale than DRAM devices.

Other types of technologies such as ferroelectric random access memory ("FRAM") devices have also been proposed. FRAM devices attempt to take advantage of the densities of the DRAM designs to create a non-volatile memory cell. Here, the ferroelectric material is often used as an alternative-material to replace conventional capacitor materials of DRAMs with the FRAM capacitor. An example of this technology has been proposed by Ramtron International of Colorado in the United States. A variety of limitations also exist with this FRAM technology. For example, a one transistor and one capacitor approach uses a reading process that is often destructive to support the charges. This is commonly called destructive read out process, also called DRO. After each read, the state must often be reinstated, which often calls for an additional programming step. Continued read and write operations degrade the FRAM material, and causes reduced reliability and efficiency of the device.

Furthermore, the FRAM capacitor size is often fixed in size. This size cannot be changed, according to scaling rules. Here, the transistor size is reduced but capacitance cannot be reduced. FRAM capacitors therefore cannot be reduced according to manufacturing problems. FRAM capacitors are often plagued with contamination and also process compatibility and reliability. Accordingly, conventional FRAM devices are often difficult to make for highly dense devices.

What is needed is an improvement FRAM technique for the manufacture of memory devices.

SUMMARY OF THE INVENTION

The present invention relates to the manufacture of objects. More particularly, the invention provides a method and resulting structure for a memory device using a ferroelectric material.

In a specific embodiment, the present invention provides a method for fabricating a non-volatile memory device. The method includes providing a substrate, e.g., silicon. The method also includes forming an oxide layer overlying the substrate; and forming a buffer layer overlying the oxide layer. A ferroelectric material is formed overlying the substrate and is formed preferably overlying the buffer layer. The method also includes forming a gate layer overlying the ferroelectric material, where the gate layer is overlying a channel region. The method further includes forming first source/drain region adjacent to a first side of the channel region and a second source/drain region adjacent to a second side of the channel region. In other embodiments, the method can also include other steps.

In an alternative specific embodiment, the present invention provides a non-volatile memory device. The device includes a substrate, e.g., silicon. The device also includes an oxide layer overlying the substrate; and a buffer layer overlying the oxide layer. A ferroelectric material is formed overlying the substrate and is formed preferably overlying the buffer layer. The device also includes a gate layer overlying the ferroelectric material, where the gate layer is overlying a channel region. The device further includes a first source/drain region adjacent to a first side of the channel region and a second source/drain region adjacent to a second side of the channel region. In other embodiments, the device can also include other features.

In one embodiment, a non-volatile memory device includes a substrate; an oxide layer overlying the substrate; a buffer layer overlying the oxide layer that is highly-oriented and has a crystalline structure, the buffer layer formed by a sputtering method; a ferroelectric material formed on the buffer layer, the ferroelectric layer being highly-oriented; a gate electrode overlying the ferroelectric material, the gate electrode overlying a channel region; and a first source/drain region adjacent to a first side of the channel region and a second source/drain region adjacent to a second side of the channel region.

In another embodiment, a non-volatile memory device includes a semiconductor substrate; an oxide layer overlying the substrate; a buffer layer on the oxide layer having a polycrystalline structure, the buffer layer formed by a sputtering method; a ferroelectric material formed on the buffer layer, the ferroelectric layer having a polycrystalline structure; a gate electrode on the ferroelectric material, the gate electrode overlying a channel region; and a first conductive region adjacent to a first side of the channel region and a second conductive region adjacent to a second side of the channel region.

In yet another embodiment, a non-volatile memory device includes a semiconductor substrate; an oxide layer overlying the substrate; a buffer layer on the oxide layer having a polycrystalline structure and a thickness of 70–1,000 angstroms, the buffer layer formed by a sputtering method and including magnesium oxide; a ferroelectric material formed on the buffer layer, the ferroelectric layer having a polycrystalline structure; a gate electrode on the ferroelectric material, the gate electrode overlying a channel region; and a first conductive region adjacent to a first side of the channel region and a second conductive region adjacent to a second side of the channel region. The ferroelectric material is a PZT film. The buffer layer has a thickness of no more than 100 angstroms in one implementation.

The present invention achieves these benefits in the context of known process technology and known techniques in the mechanical arts. However, a further understanding of the nature and advantages of the present invention may be realized by reference to the latter portions of the specification and attached drawings.

DESCRIPTION OF THE SPECIFIC EMBODIMENTS

The present invention relates to the manufacture of objects. More particularly, the invention provides a method and resulting structure for a memory device using a ferroelectric material.

Figure 1:
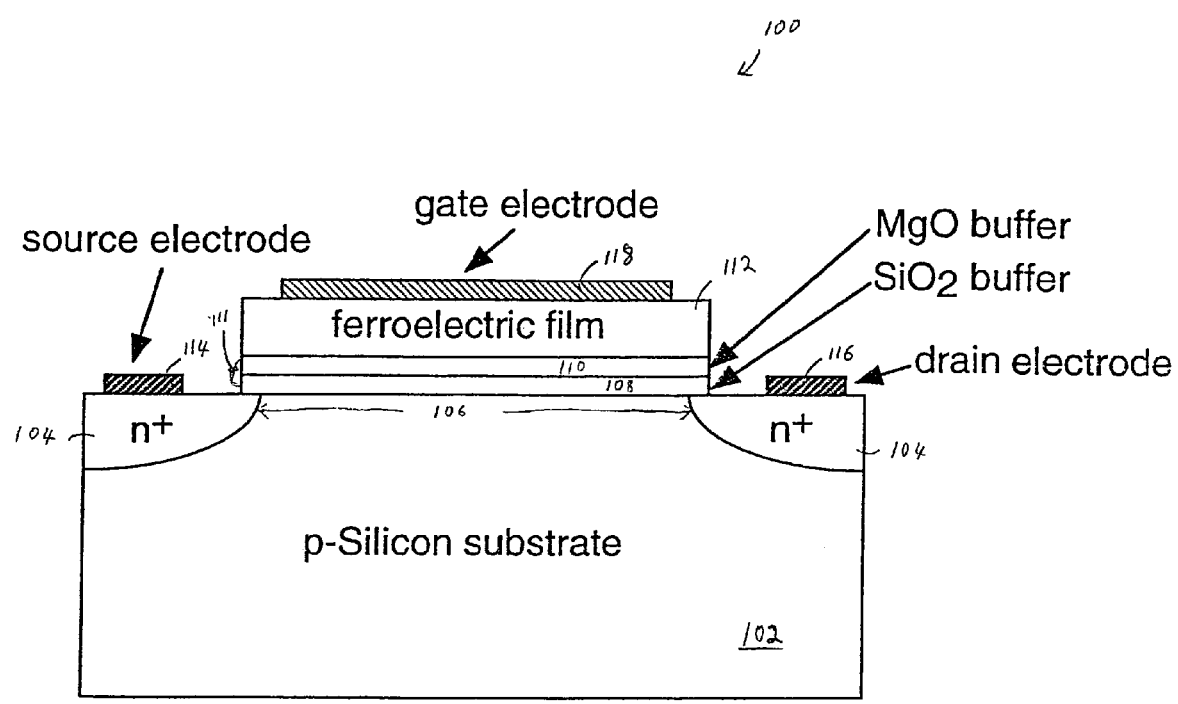
FIG. 1 is a simplified diagram of a device structure according to an embodiment of the present invention.

FIG. 1 is a simplified diagram of a ferroelectric field-effect transistor (FEFET) 100 according to an embodiment of the present invention. This diagram is merely an example which should not limit the scope of the claims herein. One of ordinary skill in the art would recognize many other variations, modifications, and alternatives. As shown, the diagram is for an N-type channel field effect transistor. In other embodiments, a P-type channel device can also be made using different dopant types.

The FEFET includes a silicon substrate 102 with a plurality of doped regions 104 and a channel region provided between the doped regions. A gate oxide or $SiO_2$ buffer is provided over the channel region. A magnesium oxide layer or MgO buffer 110 is formed over the gate oxide. The $SiO_2$ buffer and MgO buffer provide a two-layer buffer structure 111, whereon a highly-oriented ferroelectric film 112 is formed. The $SiO_2$ buffer passivates the channel region, the MgO buffer provides a highly-oriented platform to grow the ferroelectric film. The FEFET also includes source, drain, and gate electrodes 114, 116, and 118 that are electrically coupled to the source region, drain region, and ferroelectric film, respectively.

Figure 2:
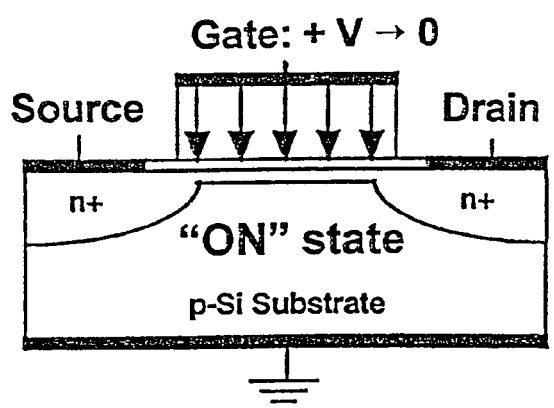
FIGS. 2 to 5 illustrate operations of a device according to an embodiment of the present invention.
Figure 3:
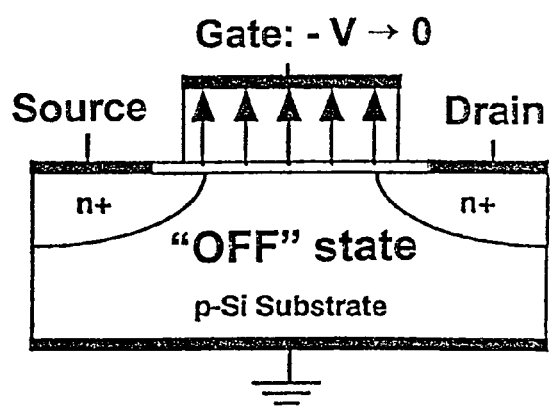

FIGS. 2 and 3 illustrate operations of a device according to an embodiment of the present invention. These diagrams are merely examples which should not limit the scope of the claims herein. One of ordinary skill in the art would recognize many other variations, modifications, and alternatives.

As shown, the transistor channel conductance is controlled by a ferroelectric polarization. Application of a positive voltage to the gate electrode sets the ferroelectric polarization in a first direction, i.e., in the downward direction. This induces or enhances an electron channel near the surface of the silicon substrate, thereby increasing the channel conductance (FIG. 2). On the other hand, application of a negative voltage to the gate electrode sets the ferroelectric polarization in a second direction, i.e., in the upward direction. This depletes electrons in the channel region, thereby decreasing the channel conductance (FIG. 3). These binary states of the channel conductance can be used to define two logic states, ON and OFF states, and can be read without destroying the ferroelectric polarization.

Figure 4:
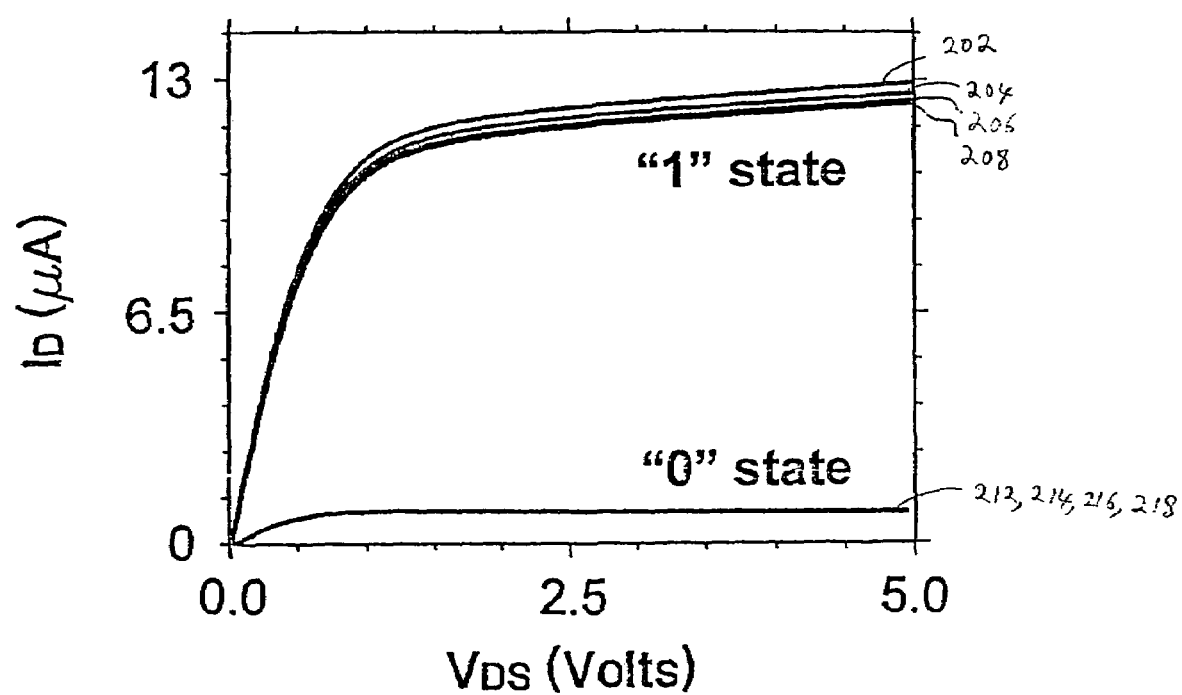
Figure 5:
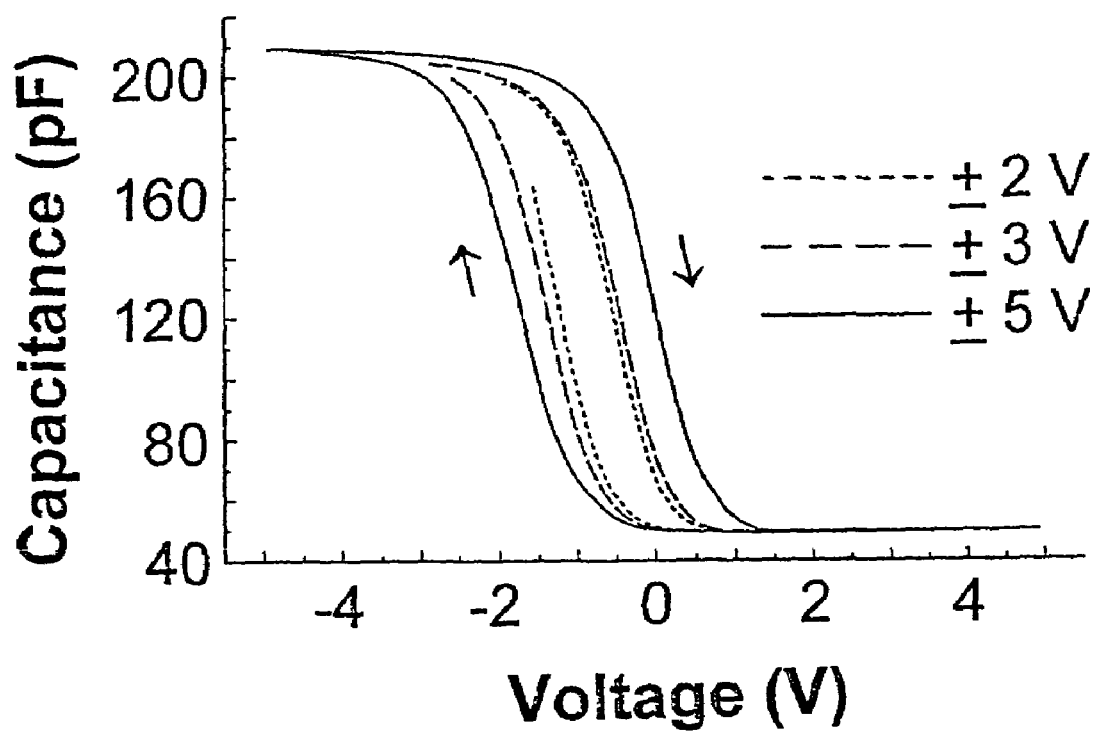
Figure 6:
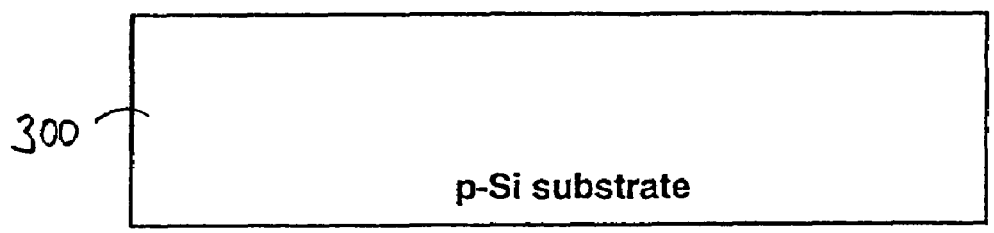
FIGS. 6 to 33 are simplified diagrams of a method according to an embodiment of the present invention
Figure 7:
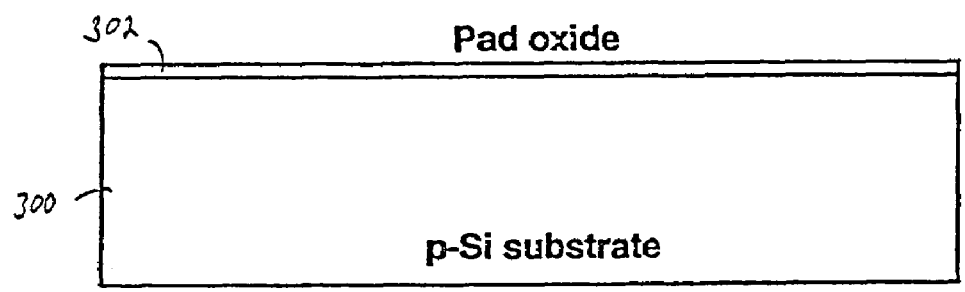

FIG. 4 shows a memory retention test result of the FEFET that incorporates a $MgO/SiO_2$ buffer layer structure. The FEFET's $I_D$-$V_{DS}$ characteristic was measured over an extended period of time for each memory state. The top set of curves, i.e., first, second, third and fourth curves 202, 204, 206, and 208, depicts the $I_D$-$V_{DS}$ characteristic of the FEFET after writing "1." The first curve represents the $I_D$-$V_{DS}$ characteristic immediately after the positive voltage was applied to the gate electrode. The second curve represents the $I_D$-$V_{DS}$ characteristic one day after the positive voltage has been applied. The channel current shows a slight decrease of about less than five percent. The third and fourth curves represent the $I_D$-$V_{DS}$ characteristic of the FEFET two and three days after the positive voltage has been applied, respectively. No noticeable change in the current scale was detected, indicating a steady state had been reached.

The results of the "0" state retention test are represented by the bottom set of curves, i.e., fifth, sixth, seventh, and eight curves 212, 214, 216, and 218, which depict the FEFET's $I_D$-$V_{DS}$ characteristic after writing "0." The fifth curve represents the $I_D$-$V_{DS}$ characteristic of the FEFET immediately after the negative voltage was applied to the gate electrode. The sixth, seven, and eight curves represent the $I_D$-$V_{DS}$ characteristic one, two, and three days, respectively, after the negative voltage has been applied. No noticeable change in the current scale was detected over three days of the retention test. In fact, no further retention degradation was detected eight weeks after the initial voltage application.

Further details of the experiments performed on the FEFET are described in, Nasir Abdul Basit, Hong Koo Kim, and Jean Blachere, "Growth of highly oriented $Pb(Zr, Ti)O_3$ films on MgO-buffered oxidized Si Substrates and its application to ferroelectric nonvolatile memory field-effect transistors," Applied Physics Letters, Volume 73, Number 26, pages 3941–3943, (Dec. 28, 1998), which is incorporated by reference for all purposes.

Figure 8:
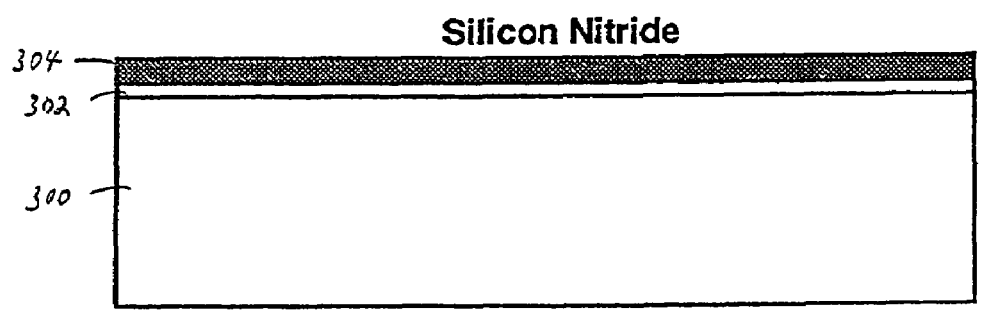
Figure 9:
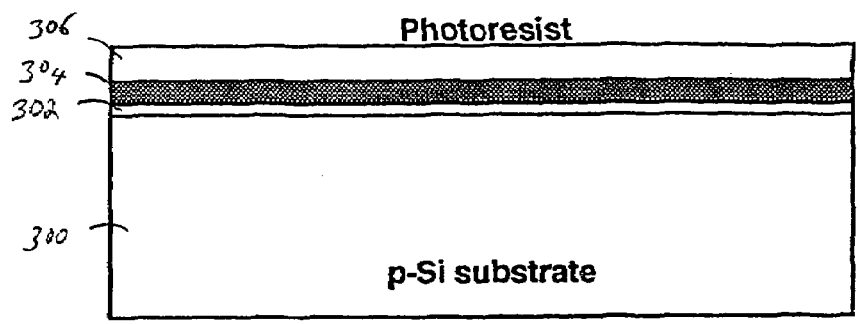

FIGS. 6 to 32 are simplified diagrams of a method according to an embodiment of the present invention. These diagram are merely examples which should not limit the scope of the claims herein. One of ordinary skill in the art would recognize many other variations, modifications, and alternatives. The present embodiment begins by providing a P conductivity silicon substrate 300, preferably of 8–10 ohm centimeter resistivity, and of crystal orientation <100>. A pad oxide layer 302 is formed over the substrate. The oxide is generally formed by a thermal oxidation processing using, for example, an annealing furnace. The pad oxide layer often has a thickness of 200–500 Å, but can be at other thickness. A silicon nitride layer 304 is formed overlying the pad oxide layer, as shown in FIG. 8. The silicon nitride layer can be made using a variety of techniques such as chemical vapor deposition ("CVD"), plasma enhanced chemical vapor deposition ("PECVD"), and others. The silicon nitride layer is generally about 1000 Å, but can be at other thickness.

A photoresist layer 306 is formed over the silicon nitride layer to perform a photolithography process. The photoresist layer is a light-sensitive material. Exposure to light causes changes in its structure and properties. Generally, the photoresist in the region exposed to the light is changed from a soluble condition to an insoluble condition. Resists of this type are called negatively acting and the chemical change is called polymerization. In other implementations, positively acting photoresist may be used, where the light changes the exposed portion of the photoresist from relatively non-soluble to much more soluble.

Figure 10A:
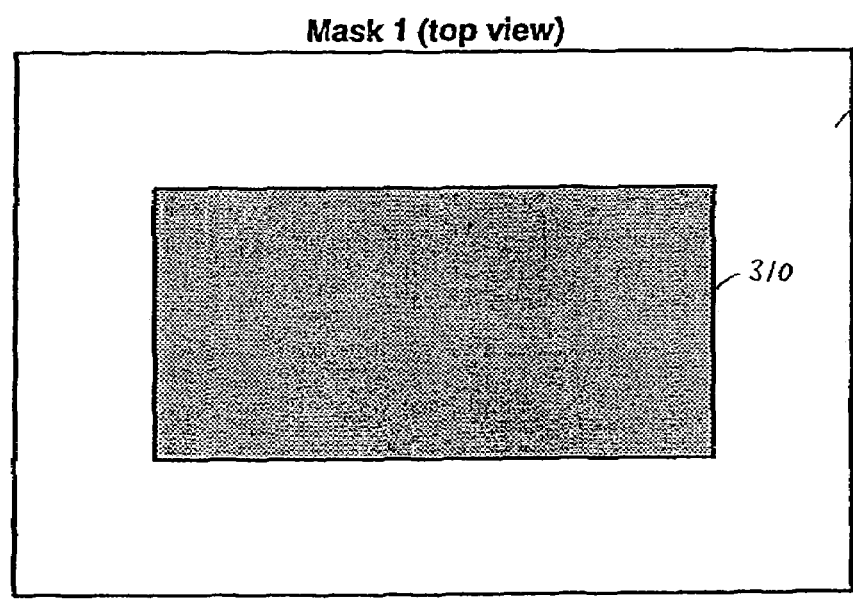
Figure 10B:
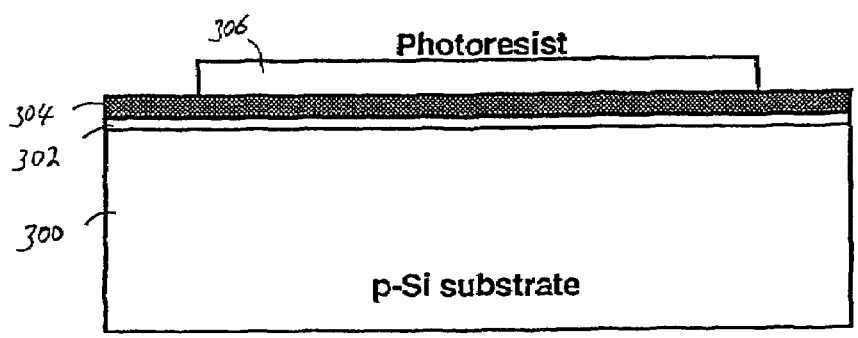
Figure 11:
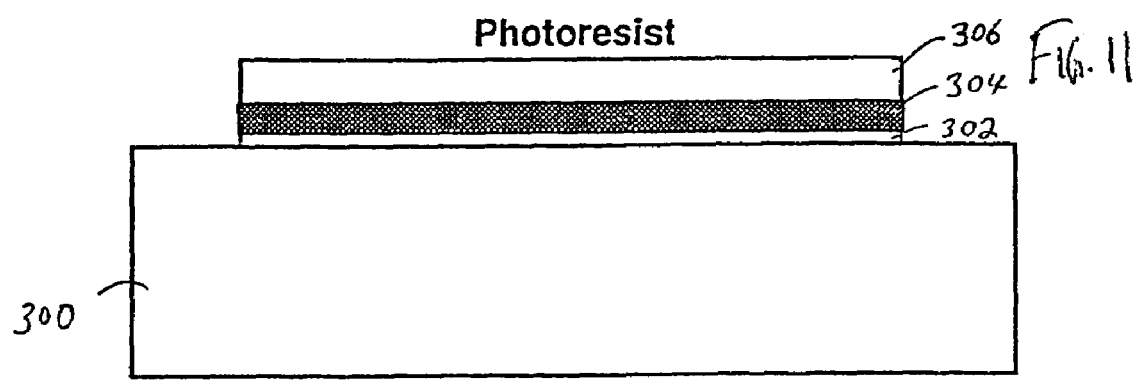

The photoresist layer is patterned using a first mask 308 with an opaque pattern 310 corresponding to the pattern desired (FIGS. 10A–11). The patterned photoresist layer exposes portions of silicon nitride layer 304. These exposed portions and portions of pad oxide 302 directly thereunder are etched away using etching techniques such as plasma etching, reactive ion etching, or the like. Generally, an anisotropic etching technique which is substantially directional in nature is used to remove the unwanted portions of the silicon nitride and pad oxide layers.

Figure 12:
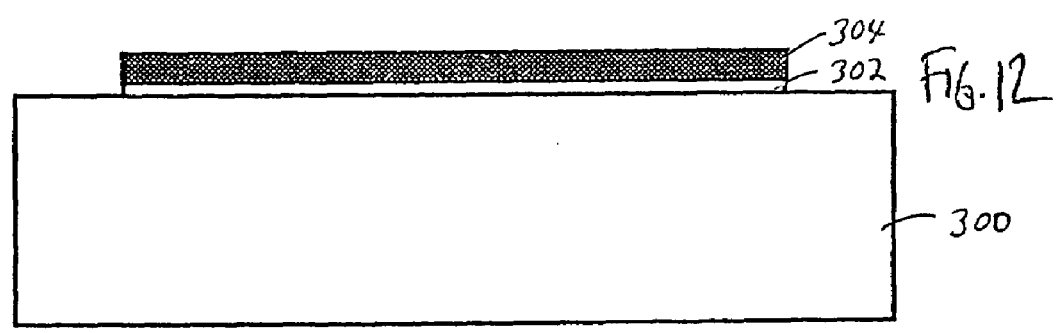
Figure 13:
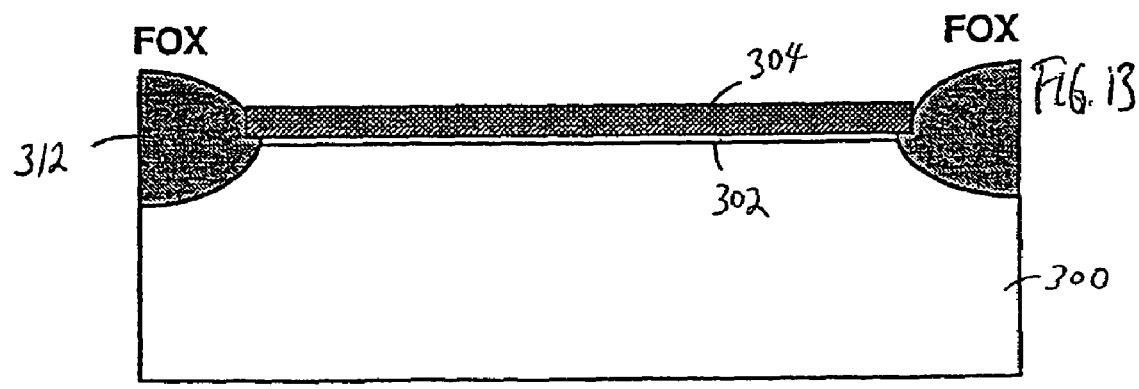

After the etching step, photoresist layer 306 is stripped from the silicon nitride layer (FIG. 12). Field oxide structure ("FOX") 312 is formed over the portions of silicon substrate exposed by the etching step. FOX 312 electrically isolates various electrically active parts on or above the substrate. As such, FOX 312 generally has a thickness of 3,000–10,000 Å, which is substantially thicker than the pad oxide or other oxides.

Figure 14:
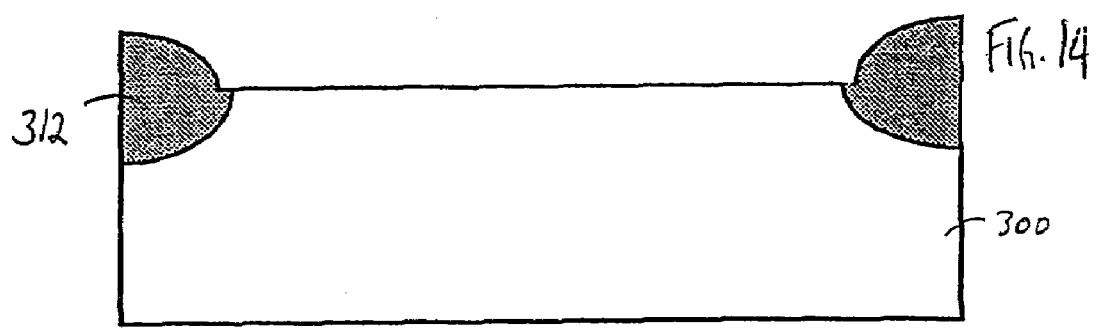
Figure 15:
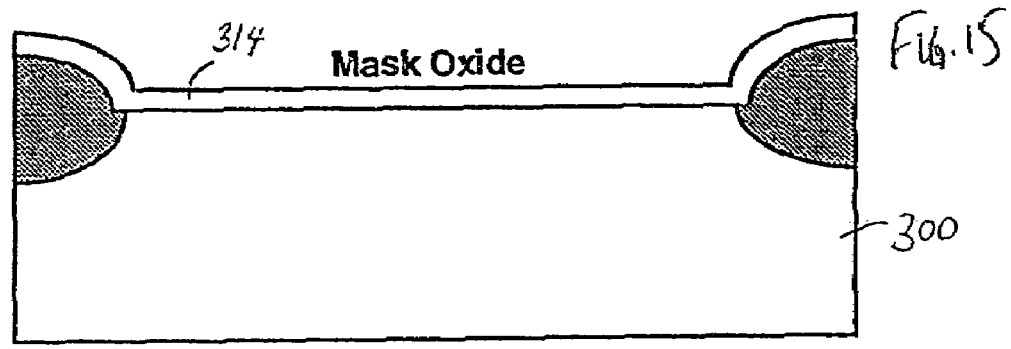
Figure 16:
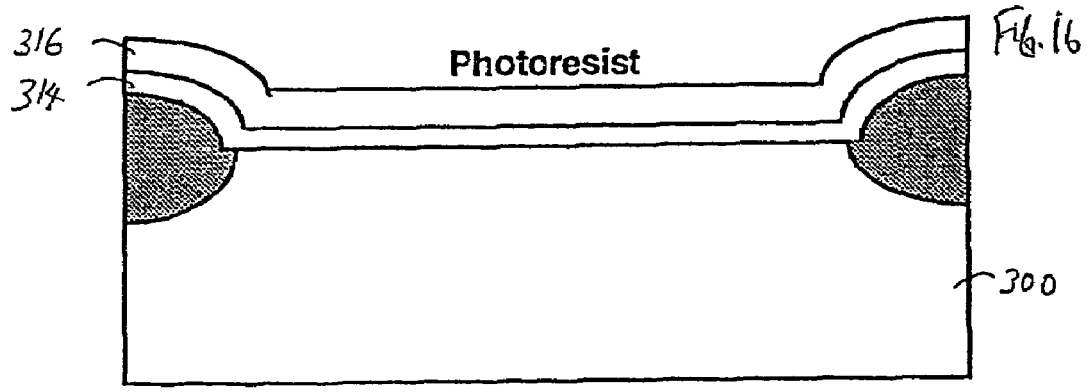

Pad oxide layer 302 and silicon nitride layer 304 are removed to expose the silicon substrate (FIG. 14). A mask oxide layer 314 is formed overlying the exposed silicon substrate. The mask oxide layer generally has 2,000–5,000 Å, but can be other thickness. A photoresist layer 316 is deposited over the mask oxide layer. Generally, negative photoresist is used, but can be positive photoresist.

Figure 17A:
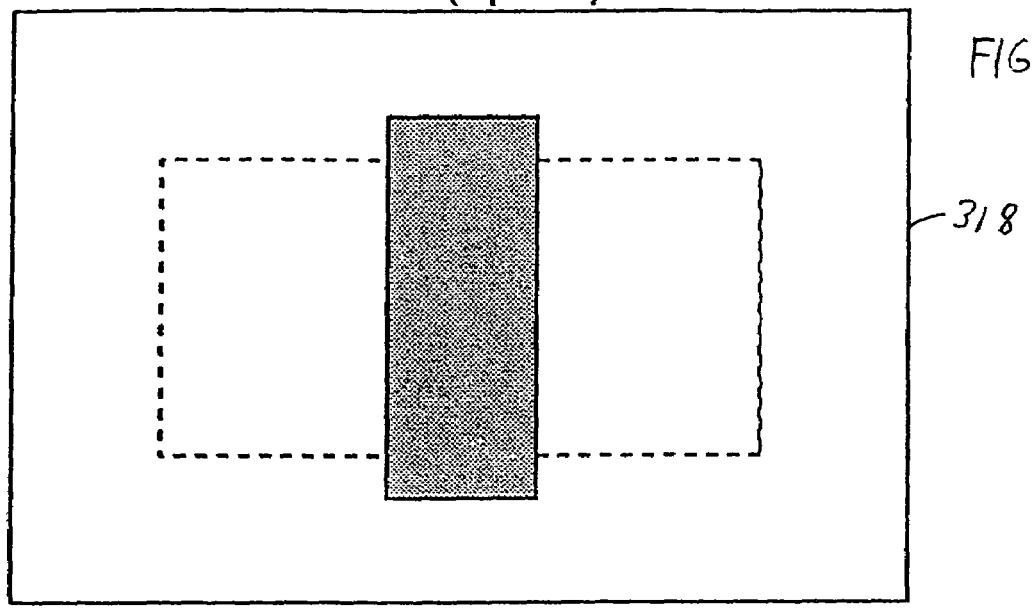
Figure 17B:
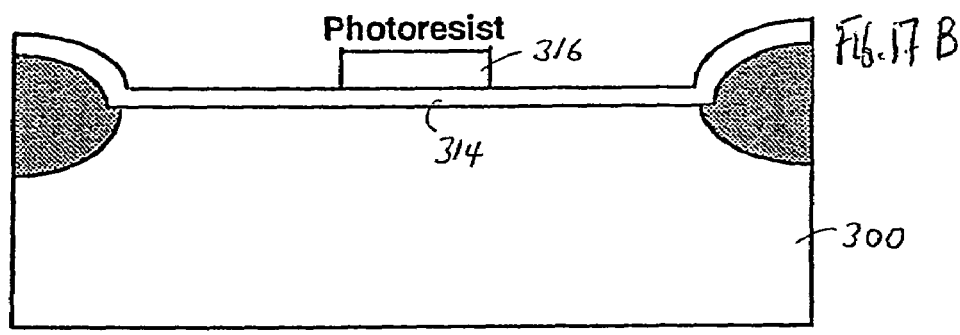
Figure 18:
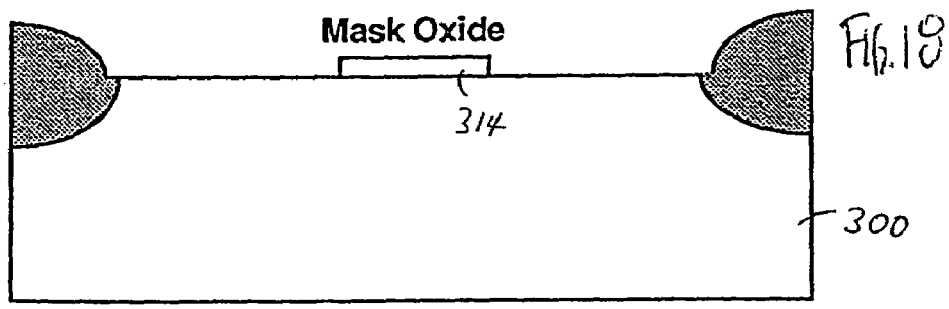

The photoresist layer is patterned using a second mask 318 (FIGS. 17A and 17B). The patterned photoresist layer exposes portions of the mask oxide layer, which are removed generally by anisotropic etching. As a result, the patterned mask oxide layer exposes selected portions of silicon substrate, defining source and drain regions and a channel therebetween.

Figure 19:
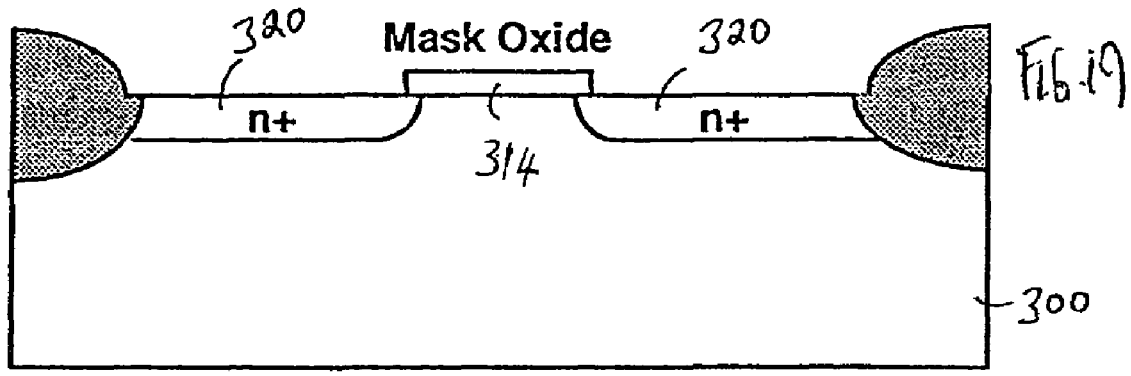

Doped regions (source and drain regions) 320 are formed on the selectively exposed portions of the silicon substrate (FIG. 19). Generally, the doped regions are formed by performing an ion implanting step using N conductivity type impurity, for example, phosphorus. In one implementation, the implantation is carried out with an energy of 2.2 MeV, but other energy levels can be used. The two doped regions define drain and source regions. During implantation step, the patterned mask oxide layer protects the silicon substrate underlying the layer, so that a portion of the silicon substrate remain free of dopants, thereby defining a channel region. In one implementation, the channel region is about one micron or less.

Figure 20:
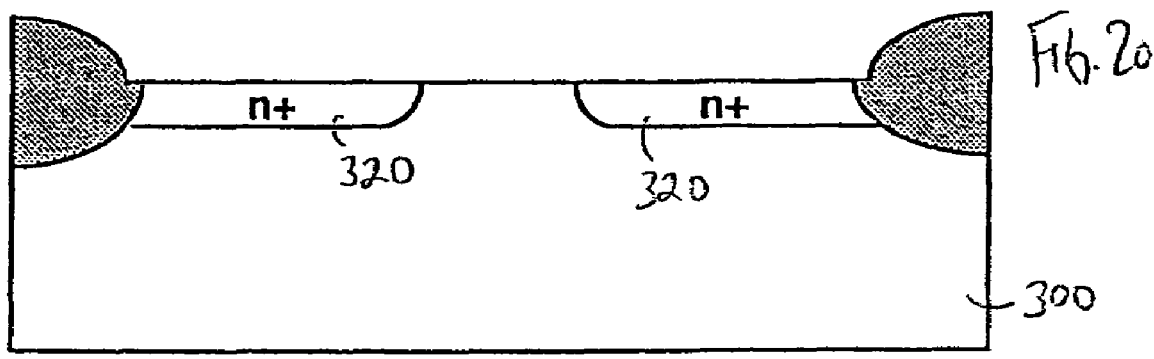
Figure 21:
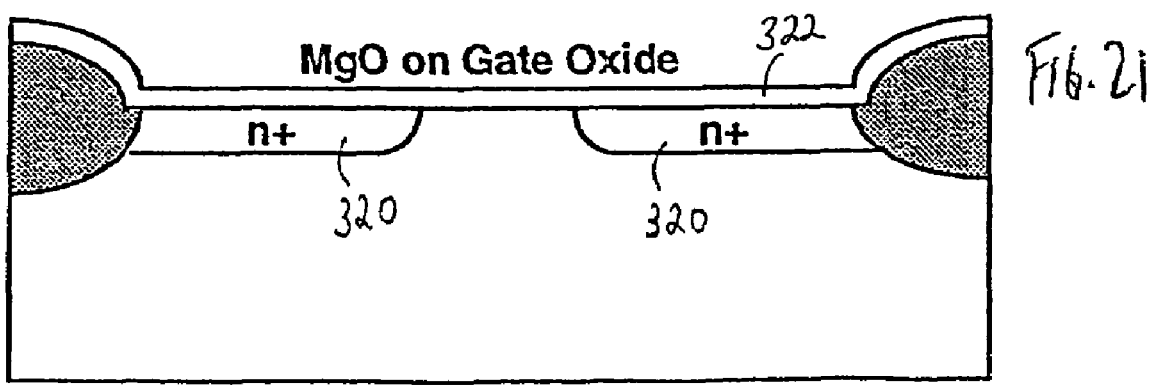

Once the doped regions have been formed, the patterned mask layer is removed (FIG. 20). A gate oxide layer (first buffer layer) and a magnesium oxide layer (second buffer layer) 322 are sequentially formed over the silicon substrate, covering the doped and channel regions. The gate oxide layer is generally thermally grown to a thickness of 100–1,000 Å, but can have other thickness. The gate oxide, like other silicon oxides, has an amorphous structure.

In one embodiment, the magnesium oxide ("MgO") layer generally is formed to a thickness of 70–1,000 angstrom by a sputtering process using a pure magnesium target. During the sputtering step, the chamber is provided with an oxygen-bearing atmosphere such as argon/oxygen gas mixture and kept at a temperature of 400–500 Celsius. After deposition, the MgO layer is annealed for about 30 minutes in a temperature of 800–1,000 Celsius. The annealing step enhances the alignment of MgO crystallites in a highly oriented pattern. A ferroelectric layer to be deposited over the second buffer of MgO layer requires a highly oriented substrate to promote growth of a highly-oriented ferroelectric thereon. The annealing step is particuraly useful when working with thin MgO layers since they are more likely to have amorphous or poorly oriented structures as deposited. Generally, the highly-oriented MgO and ferroelectric layers have polycrystalline structures.

As explained above, the gate oxide and MgO layers, i.e., two-layer buffer, are provided at least for the following reasons. Highly oriented ferroelectric layer, i.e., $Pb(Zr,Ti)_3$ ("ZT") film, requires a highly-oriented platform such as the MgO layer and cannot be grown directly on an amorphous platform such as the gate oxide layer. However, the thermally grown gate oxide layer is one of the best ways to passivate the silicon surfaces and thus to produce high quality FET channels. In addition a diffusion barrier layer is needed between the silicon substrate and the PZT layer. The MgO layer serves as a good diffusion barrier layer because of its refractory nature.

Figure 22:
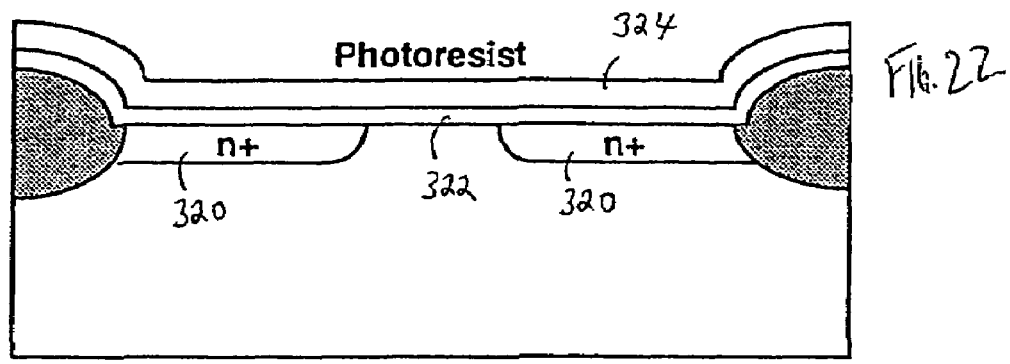
Figure 23A:
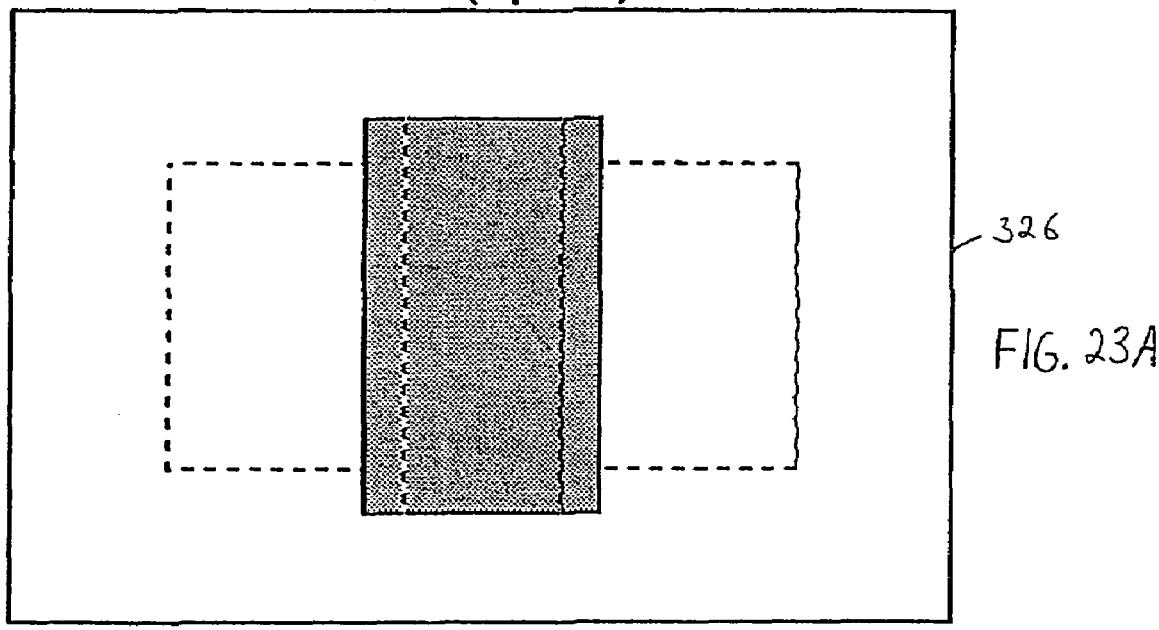
Figure 23B:
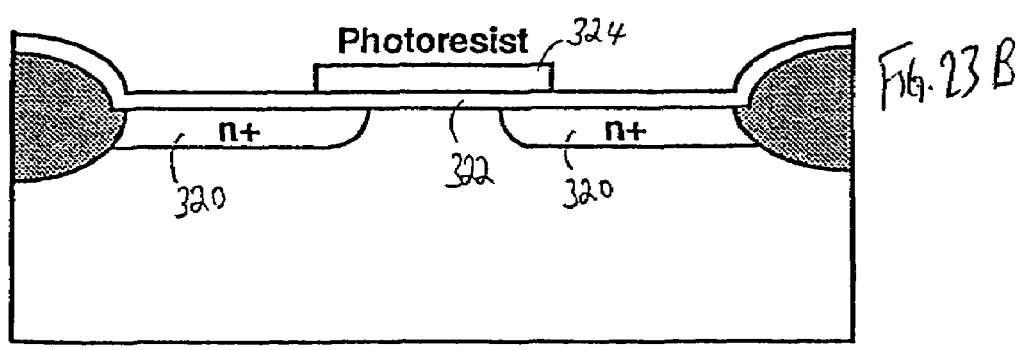
Figure 24:
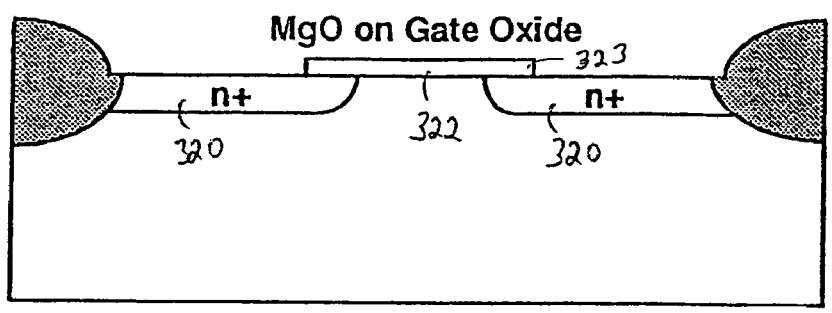
Figure 25:
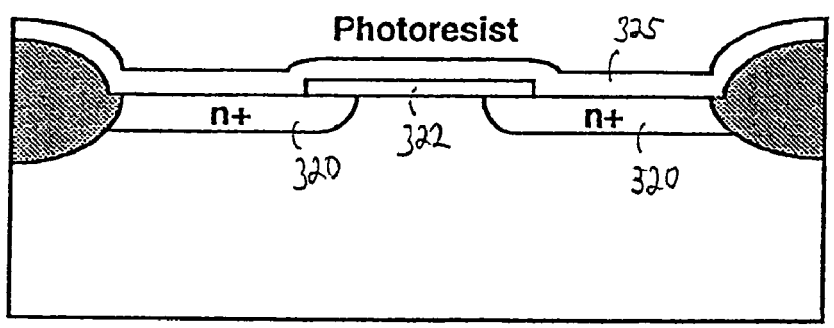
Figure 26A:
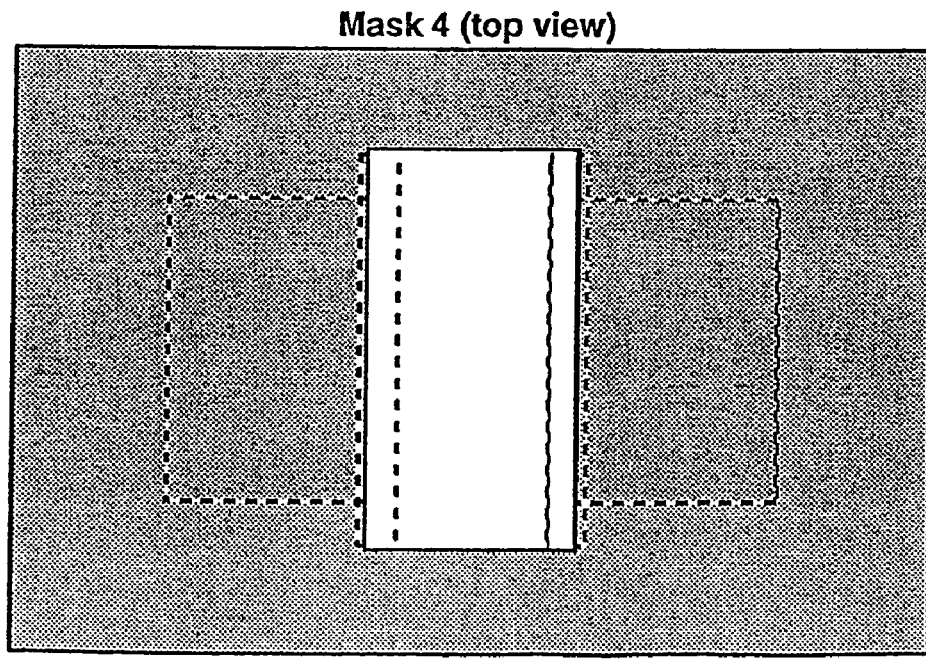
Figure 26B:
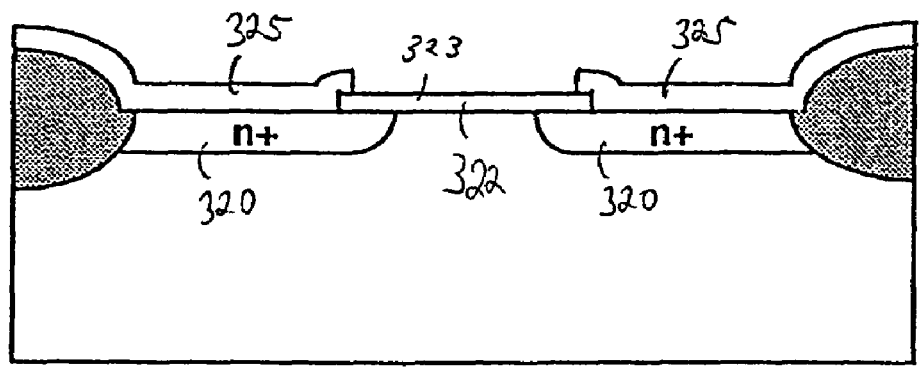
Figure 27:
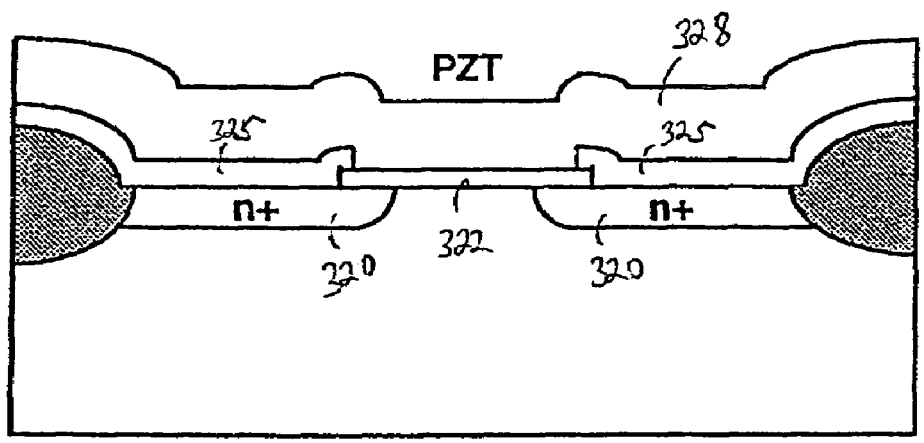

Referring to FIG. 22, a photoresist layer 324 is deposited over the two-layer buffer. The photoresist is patterned using a third mask 326. The patterned photoresist exposes portions of the two-layer buffer directly overlying the doped regions. The exposed portions of two-layer buffer 322 are etched away to define a buffer structure 323. A photoresist layer 325 is formed over the buffer structure and the doped regions. A portion of photoresist layer 325 directly overlying the buffer structure is etched using a fourth mask 326. As a result, an upper surface of the buffer structure is exposed.

A ferroelectric layer 328 of no more than 1000 Å is deposited over the buffer structures and photoresist layer 325, so that the ferroelectric layer is contacting the upper surface of the buffer layer, i.e., the highly-oriented MgO layer, enabling the ferroelectric layer to have a highly oriented pattern. In one implementation, the ferroelectric layer is a PZT layer deposited to a thickness of 0.3–2.7 μm using the following conditions: rf power of 60 W, target substrate distance of 1.5 inch, argon/oxygen ambient of 15 mTorr, and substrate temperature of 100° C. The PZT layer is annealed at 600–650° C. for 10–20 minutes in air ambient using a conventional furnace.

Figure 28:
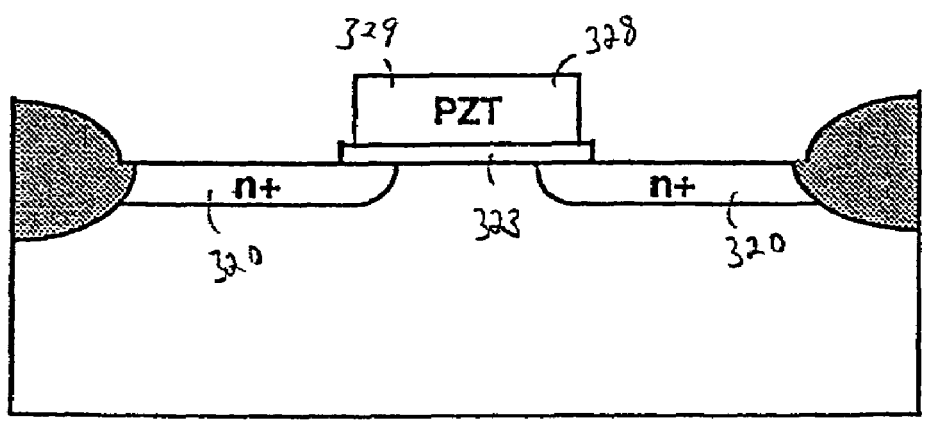
Figure 29:
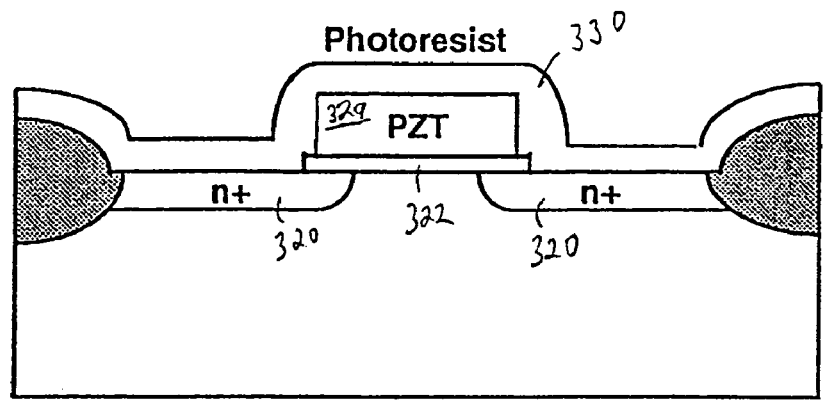
Figure 30A:
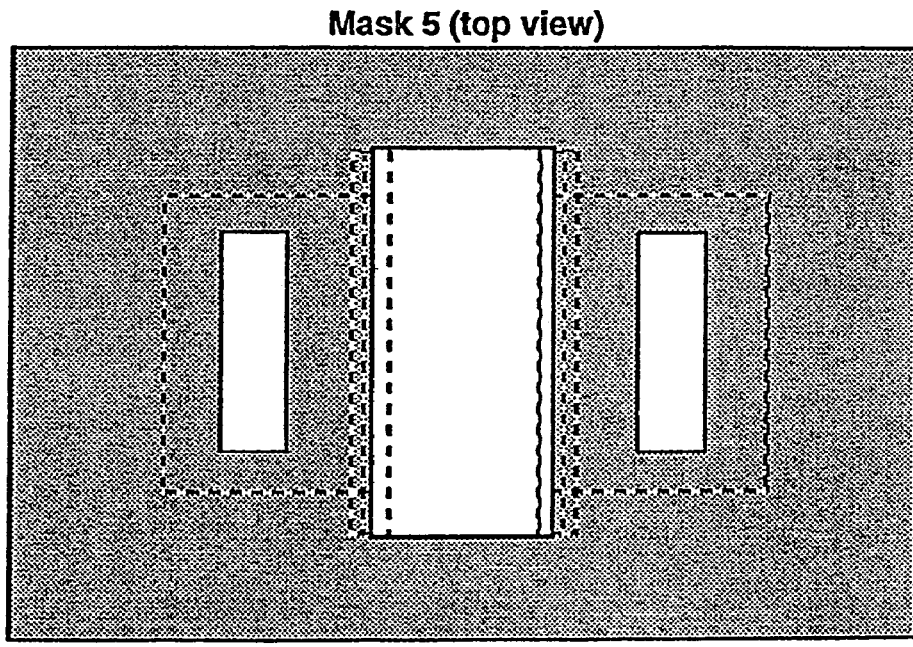
Figure 30B:
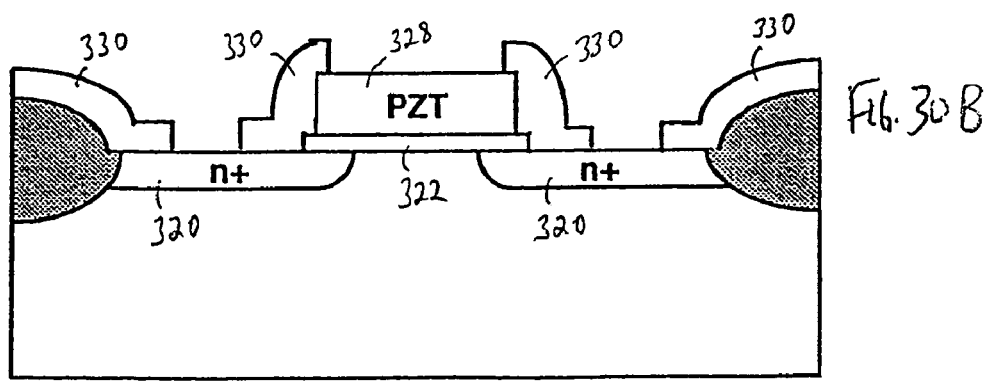
Figure 31:
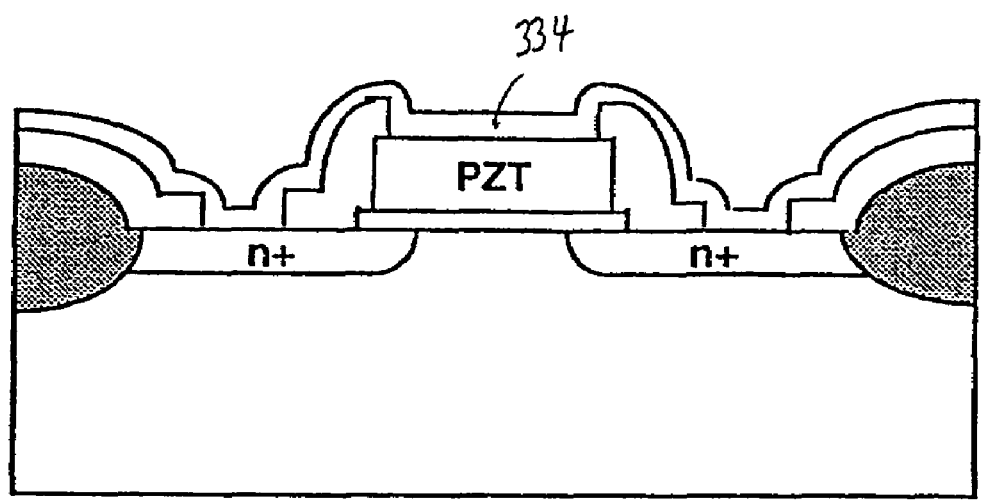
Figure 32:
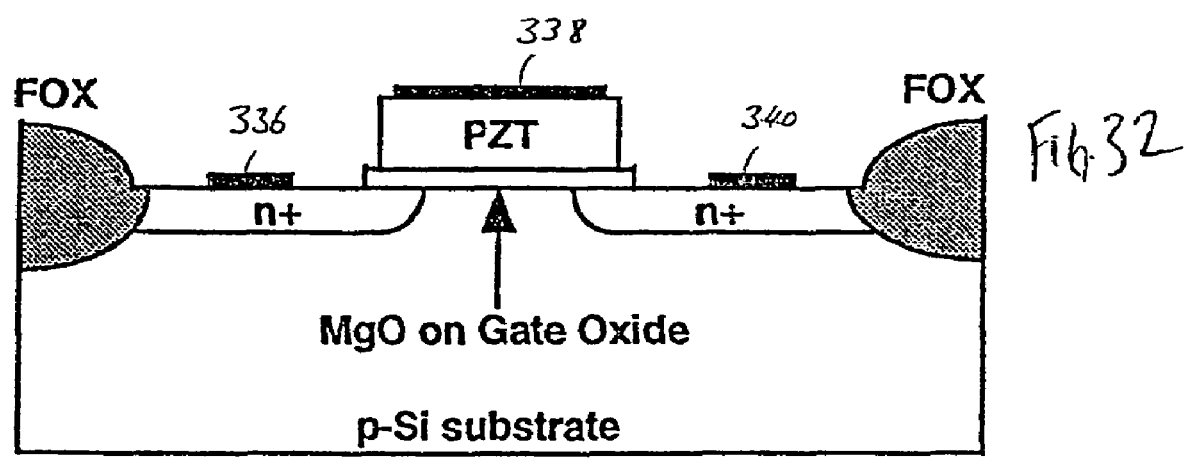
Figure 33:
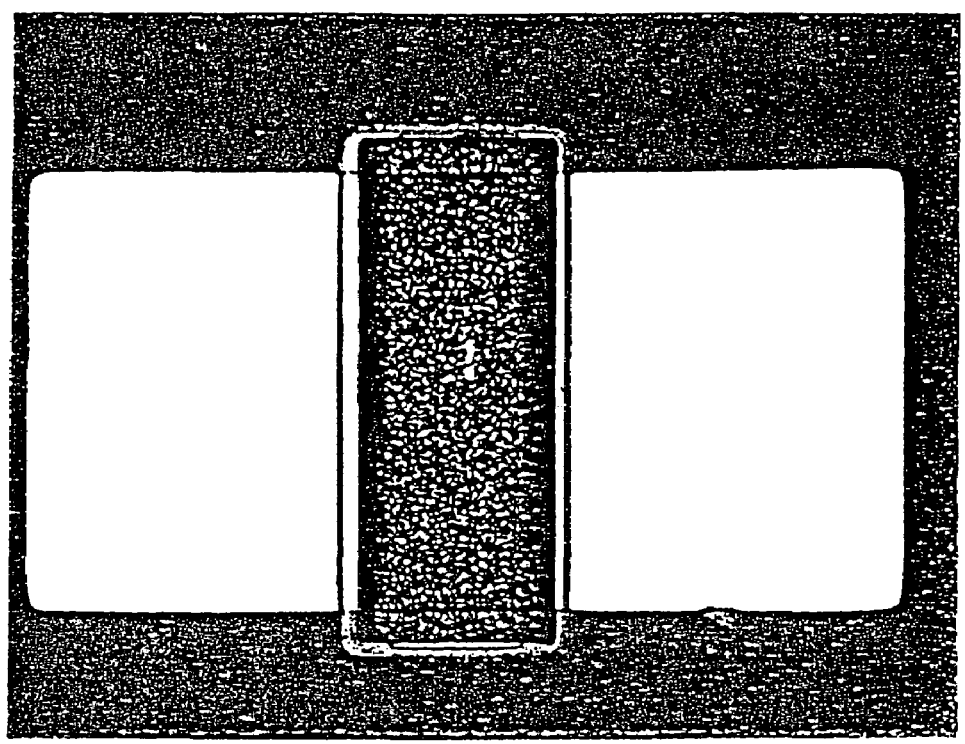

The PZT layer is patterned to form a PZT structure 329 overlying the buffer structure (FIG. 28). A photoresist layer 330 is formed over the PZT structure and the doped regions. The photoresist is patterned to expose an upper surface of the PZT structure and portions of the doped region, using a fifth mask 332. An electrode layer is formed over the photoresist, contacting the PZT structure and doped regions. The electrode layer is etched to form a first electrode (source/drain electrode) 336, a second electrode (gate electrode) 338, and a third electrode (source/drain electrode) 340. FIG. 33 shows a top-plane-view photograph of an FEFET formed using the methods described above.

While the above is a full description of the specific embodiments, various modifications, alternative constructions and equivalents known to those of ordinary skill in the relevant arts may be used. For example, while the description above is in terms of a semiconductor wafer, it would be possible to implement the present invention with almost any type of article having a surface or the like. In addition, while the description above described forming the PZT layer over the MgO and photoresist layers, the PZT layer may be formed on the MgO layer entirely. Therefore, the above description and illustrations should not be taken as limiting the scope of the present invention which is defined by the appended claims.

What is claimed is:

1. A non-volatile memory device, comprising:
   a p-type substrate;
   an oxide layer overlying the substrate;
   a buffer layer overlying the oxide layer that is highly-oriented and has a crystalline structure;
   a ferroelectric material formed on the buffer layer, the ferroelectric layer being highly-oriented;
   a gate electrode overlying the ferroelectric material, the gate electrode overlying a channel region; and
   a first source/drain region adjacent to a first side of the channel region and a second source/drain region adjacent to a second side of the channel region,
   wherein the buffer layer is a MgO layer that has been formed on the oxide layer to a thickness of less than 10 nm using a sputtering method.

2. The non-volatile memory device of claim 1, wherein the buffer layer has a polycrystalline structure.

3. The non-volatile memory device of claim 1, wherein the ferroelectric material is highly oriented.

4. The non-volatile memory device of claim 1, wherein the oxide layer is provided by a dry oxidation process comprising an oxygen bearing compound.

5. The non-volatile memory device of claim 1, wherein the buffer layer is thermally annealed to enhance an alignment of crystallites of the MgO layer.

6. The non-volatile memory device of claim 5 wherein the buffer layer is thermally annealed at a temperature of 800–1000 degrees Celsius.

7. The non-volatile memory device of claim 1 wherein the ferroelectric material is a PZT bearing compound, wherein the thickness of the buffer layer is 7 nm.

8. The non-volatile memory device of claim 7, wherein the ferroelectric material has a thickness of less than about 1,000 angstroms.

9. The non-volatile memory device of claim 7, wherein the ferroelectric material has a thickness of about 100 angstroms and greater.

* * * * *